(12) United States Patent
Sarti (10) Patent No.: US 9,552,031 B2
(45) Date of Patent: Jan. 24, 2017

(54) POWER SHELF FOR COMPUTER SERVERS

(71) Applicant: Facebook, Inc., Menlo Park, CA (US)

(72) Inventor: Pierluigi Sarti, Milpitas, CA (US)

(73) Assignee: Facebook, Inc., Menlo Park, CA (US)

( * ) Notice: Subject to any disclaimer, the term of this patent is extended or adjusted under 35 U.S.C. 154(b) by 287 days.

(21) Appl. No.: 14/251,174

(22) Filed: Apr. 11, 2014

(65) Prior Publication Data

US 2015/0177808 A1 Jun. 25, 2015

Related U.S. Application Data

(60) Provisional application No. 61/918,893, filed on Dec. 20, 2013, provisional application No. 61/929,636, filed on Jan. 21, 2014.

(51) Int. Cl.
*G06F 1/26* (2006.01)
*G01R 31/36* (2006.01)
*G06F 1/30* (2006.01)
*G06F 1/18* (2006.01)

(52) U.S. Cl.
CPC .............. *G06F 1/30* (2013.01); *G06F 1/189* (2013.01); *G06F 1/263* (2013.01)

(58) Field of Classification Search
CPC ............. G06F 1/189; G06F 1/263; G06F 1/30
USPC ............................................ 713/300; 702/63
See application file for complete search history.

(56) References Cited

U.S. PATENT DOCUMENTS

| 6,295,215 | B1 | 9/2001 | Faria et al. |
| 7,892,108 | B2 | 2/2011 | Kuo |
| 7,974,796 | B2 | 7/2011 | Tamai |
| 9,110,107 | B2* | 8/2015 | Busca |
| 9,148,068 | B2 | 9/2015 | Sarti et al. |
| 2003/0197428 | A1 | 10/2003 | Hatton et al. |
| 2005/0146223 | A1* | 7/2005 | Kanouda .................. G06F 1/30 307/66 |
| 2005/0162830 | A1* | 7/2005 | Wortman ........... H05K 7/20572 361/695 |
| 2009/0164820 | A1* | 6/2009 | Abraham .................. G06F 1/30 713/323 |
| 2011/0057724 | A1 | 3/2011 | Pabon et al. |

(Continued)

OTHER PUBLICATIONS

U.S. Appl. No. 13/693,530 of Sarti, P. filed Dec. 4, 2012.

(Continued)

*Primary Examiner* — Mark Connolly
(74) *Attorney, Agent, or Firm* — Perkins Coie LLP (57) ABSTRACT

At least one embodiment of this disclosure includes a power shelf for serving a power zone within an IT equipment rack. The power shelf includes: a DC bus configured to provide DC power to rack-mounted equipment within the power zone; multiple pairs of backup battery units (BBUs) and power supply units (PSUs), wherein the multiple pairs include at least a redundant pair, such that voltage and power is supplied through the DC bus sufficient to power the rack-mounted equipment even when one of the multiple pairs is inoperative; and a power circuit, in each PSU of each of the multiple pairs, configured to rectify an AC phase from an external multi-phase AC power source, wherein the power circuit is configured to draw power from one of the BBUs paired to the PSU when the PSU fails to provide power sufficient to power the rack-mounted equipment.

10 Claims, 7 Drawing Sheets

(56) References Cited

U.S. PATENT DOCUMENTS

| | | | |
|---|---|---|---|
| 2012/0013186 A1* | 1/2012 | Sarti | G06F 1/30 |
| | | | 307/23 |
| 2012/0153720 A1* | 6/2012 | Chang | H02J 7/34 |
| | | | 307/23 |
| 2013/0154365 A1 | 6/2013 | Sarti | |
| 2013/0227309 A1* | 8/2013 | Jau | H05K 7/1492 |
| | | | 713/300 |
| 2015/0177808 A1* | 6/2015 | Sarti | G06F 1/30 |
| | | | 713/300 |
| 2015/0180233 A1* | 6/2015 | Yamada | H02J 1/08 |
| | | | 307/23 |

OTHER PUBLICATIONS

U.S. Appl. No. 14/853,526 of Ebrahimzadeh, S. filed Sep. 14, 2015.
U.S. Appl. No. 14/873,585 of Sarti, P. filed Oct. 2, 2015.
U.S. Appl. No. 14/941,005 of Sarti, P. filed Nov. 13, 2015.
U.S. Appl. No. 14/958,648 of Sarti, P. filed Dec. 3, 2015.
Choi, et al.: "New 24-Pulse Diode Rectifier Systems for Utility Interface of High-Power AC Motor Drives." IEEE Transactions on Industry Applications, vol. 33, No. 2, Mar./Apr. 1997, 11 pages.
U.S. Appl. No. 15/153,348 of Sarti, P., et al. filed May 12, 2016.
Notice of Allowance mailed Jun. 23, 2015, for U.S. Appl. No. 13/693,530 of Sarti, P. filed Dec. 4, 2012.

\* cited by examiner

POWER SHELF FOR COMPUTER SERVERS

CROSS-REFERENCE TO RELATED APPLICATION(S)

This application claims to the benefit of U.S. Provisional Patent Application Ser. No. 61/918,893, entitled "POWER SHELF V2," which was filed on Dec. 20, 2013, and U.S. Provisional Patent Application No. 61/929,636, entitled "POWER SHELF WITH POWER BACKUP CAPABILITY," which was filed on Jan. 21, 2014, both of which are incorporated by reference herein in their entirety.

RELATED FIELD

At least one embodiment of this disclosure relates generally to data centers, and in particular to providing power for rack-mounted equipment in a data center upon failure of a main power circuit in the power supply system for a rack.

BACKGROUND

With the advent of the Internet, data centers have become a practical and viable solution for cloud computing or any large-scale IT operations for business and services. A data center typically houses racks of computer servers, which provide both processing and data storage functionalities, as well as telecommunication and networking equipment, such as switches and routers, to support the communication requirements of the servers. Data center components are often collocated, where resources are shared across an organization or among multiple organizations.

Given the centralized nature of data centers, it is beneficial to maximize the service availability because downtime may result in severe consequences to those who rely on the data center and lost income to the data center operators. Since a primary cause of data center downtime is power failures, data centers are often equipped with backup power systems, such as uninterruptible power supplies (UPS) and generators. In addition, massive energy consumption by data centers causes increased resource depletion and greenhouse gas emission, among other environmental concerns. Accordingly, efficient power solutions are desired that not only guarantee high power availability, but are also cost-effective and environmentally-friendly.

The figures depict various embodiments of the disclosure for purposes of illustration only. One skilled in the art will readily recognize from the following discussion that alternative embodiments of the structures and methods illustrated herein may be employed without departing from the principles of the invention described herein.

DETAILED DESCRIPTION

Embodiments of this disclosure provide a power supply system for a server rack. The power supply system can be a power shelf inside the server rack; and can include a power supply circuit that takes inputs from both an alternating current (AC) power source (e.g., one of three phase AC from a power grid of a commercial or government-run power company or other single phase AC source) and a direct current (DC) power source (e.g., a Backup Battery Unit (BBU) embedded in the power supply system or through an external DC source) such that power can be seamlessly drawn from either (e.g., AC or DC) power sources or both without disrupting the consistency of the power supplied to the server rack. While most homes are wired with single-phase AC voltage delivered over two hot wires and one neutral wire, most commercial businesses are wired (e.g., from a power grid) with three-phase AC voltages separated from each other by 120 electrical degrees (e.g., a third of a time cycle). These wires deliver power over three hot wires and optionally using also a fourth neutral wire.

Embodiments provide a power shelf (e.g., an uninterrupted power supply (UPS) shelf) that utilizes the load-balancing benefits of the three-phase input from the power grid. The power shelf can rectify each phase (e.g., a hot wire and a neutral wire) in parallel to provide DC voltage through a single DC bus pair (e.g., a positive and negative DC low voltage terminations, the negative termination also known as a "negative return"). The DC bus pair can provide power to rack-mounted equipment in a "power zone." In some embodiments, each power shelf includes three pairs of power supply unit (PSU) and BBU. In other embodiments, each power shelf can include multiples of three pairs of the PSU and BBU. Each pair may be referred to as a "power module." Each PSU in each pair can receive one of the three AC phases from the AC power source. This enables the power supply system to draw from the 3-phase power in a way that the power never or rarely falls to zero, meaning that the load is the same at any instant, ensuring a substantially perfect balance of the input AC three phases. The three pairs (e.g., the three power modules) are coupled in parallel to a DC bus to provide power to the rack-mounted equipment within the server rack. The power modules share the output current with high precision, so as to guarantee substantially similar input AC currents, to achieve the required input AC three-phase balance. The three power module configuration provides a (2+1) redundant scheme such that a BBU can be tested without compromising the power shelf performance (e.g., one power module can be undergoing BBU testing while the other two power modules sufficiently provide full power to the servers, even in case of AC outage).

Inside the power supply circuit of each PSU installed in the power shelf, an AC power source (e.g., a single phase of the three-phase power source from the power grid) is electrically coupled in series to a rectifier circuit (e.g., including or excluding an interference protection sub-circuit) or a bridgeless circuit with at least two diodes in series from the AC power source to a shared voltage node. In some embodiments, a power factor correction (PFC) module may be connected in series between the rectifier circuit or the bridgeless circuit and the shared voltage node. The shared voltage node may be referred to as the "BULK voltage node." The BULK voltage node serves as a DC power source followed by a DC-DC converter that generates power supplied to the system. The terminal to the DC power source is electrically coupled in parallel to the output of a separated DC-DC step up converter (e.g., a current feed converter) followed by a bridge diode to the shared voltage node. The step up converter may be referred to as the "backup power converter." In some embodiments, at least two diodes (e.g., silicon diodes) are in series to the front-end rectifier circuit, or bridgeless circuit, to lower (e.g., significantly lower) the likelihood that energy delivered by the backup power converter can reach the input AC power grid (e.g., at AC outage). The above circuit series at the shared voltage node is electrically coupled in parallel to a bulk capacitor to hold power for at least one cycle of the AC current from the AC power source, in case of AC loss at full load. A high-efficiency DC-DC converter then draws power from the shared voltage node to supply power to the loads in the server rack.

Under normal operation, AC power is provided through one of the three AC phases to each PSU. During normal operation, each BBU in each pair can be charged by a constant current (e.g., by a charger build inside the power module). A battery charger can be coupled between the shared voltage node and the BBU to provide suitable voltage to charge the BBU. Power is discharged from the BBU either when AC power is interrupted (e.g., during a power grid failure before an emergency power generator is online) or when a power module (e.g., implemented through a controller chip or a logic unit inside the power module) is testing its BBU (e.g., a periodical battery test).

In some embodiments, each of the BBUs in the power shelf gets automatically tested periodically or in accordance with a system-configured or operator-configured schedule. The power management module of the power shelf can control the current feeder converter. During a battery test, the power management module instructs the current feeder converter to discharge the BBU at constant power (e.g., 500 W), or optionally at an actual real-time system consumption power (e.g., the battery tests would start only if the system power is at least 1500 W with a minimum 500 W output from each of the individual power modules). In embodiments, only one BBU can perform a battery test in the power shelf at the same time (e.g., when there are three BBUs in the shelf). In these embodiments, the power shelf needs to be in redundant status (e.g., no failures in the power shelf and all the components are functionally installed in the power shelf) for the battery test to commence. If the power shelf is not in the redundant status, BBU test requests are queued until such conditions are met. The current feeder converter in the power supply circuit can draw constant power or system real-time power from the BBU. Because the shared voltage node maintains a substantially constant DC voltage (e.g., 440V), the constant current enables a constant power discharge of the BBU. The "Status of Health" of the BBU can be assessed by a BBU logic unit during battery test discharge, regardless of the discharge profile, even when a constant current profile is preferred.

In one example, the system-configured schedule of the BBU test can be periodic with a random initial wait time. The random initial wait time can be written in the BBU's memory (e.g., EEPROM) at the time of manufacturing. A clock for the battery test schedule can start when the BBU enters service in the power shelf, when exiting the Sleep Mode, or in other situations when the BBU is not installed in the power shelf. That is, a BBU test can be assigned to occur periodically. However, the periodic BBU tests can be staggered based on a random initial wait time assignment. For example, the random initial wait time of each BBU test can be selected from random discrete intervals of time (e.g., 1 hour, 2 hour, 3 hour, etc. until 24 hour), dynamically assigned by the power module (master) after the BBU (slave) request to be tested. This start time can be randomly assigned by the power module. This random assignment can occur after a power module's BBU requests a BBU test or if a logic circuitry in the power module detects a need to test the BBU. In some embodiments, each BBU in each power shelf of each server rack in a data center can store a random number for the initial day of the first battery test; after that, battery testing can be scheduled to repeat again every fixed time (e.g., every 90 days).

During the BBU test, the PFC module and the rectifier circuit can be turned off or the PFC can share the current with the step-up converter. Accordingly, there can be a 3-phase unbalance during the BBU test (e.g., 7 to 8 minutes). The power supply of the data center can normally handle some amount of unbalance across the 3 phases on a few racks at the same time, from a same AC circuit branch. However, if multiple BBU tests occur on the same 3 phase wires, the cumulative three-phase unbalance may cause instability in the AC power supply to the data center. This problem is mitigated by the nature of the random battery test occurrences, which statistically reduces the chance of the instability happening. The feature of assigning a random initial day and wait time is advantageous by greatly decreasing the likelihood that any periodic BBU test overlaps with each other.

Figure 1A:
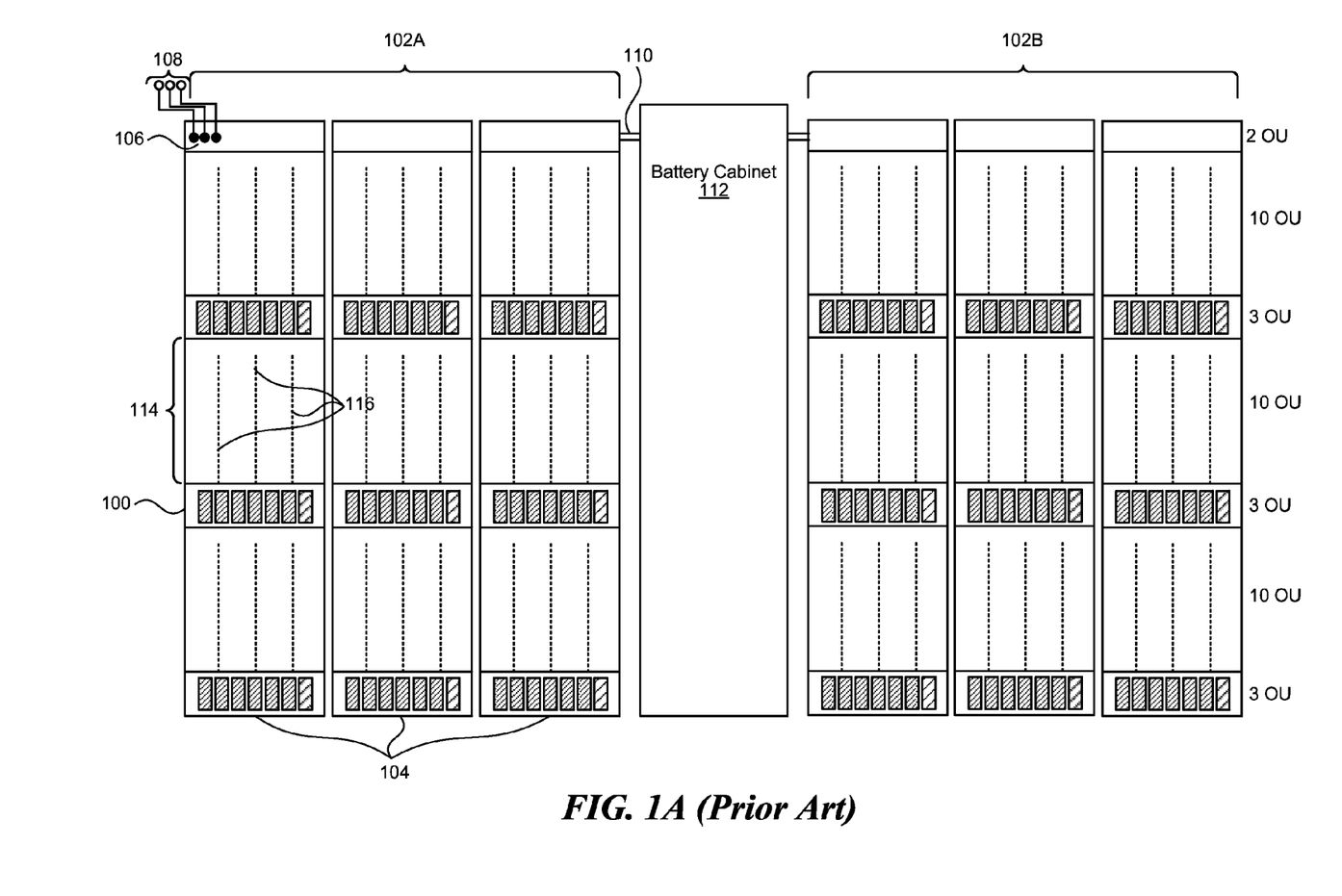
FIG. 1A is a diagram illustrating power shelves for server racks in a data center according to a previous power solution utilizing an external local battery cabinet.

FIG. 1A is a diagram illustrating power shelves (e.g., a power shelf 100) for server racks (e.g., a server rack 102A and a server rack 102B, collectively as the "server racks 102") in a data center according to a previous power solution utilizing an external local battery cabinet. Each of the server racks 102 includes three rack columns 104, A top power rail 106 encloses power lines, breakers, receptacles and plugs at the back, three AC voltage input lines 108 with three-phase plugs, and three DC voltage input lines 110. The DC voltage input lines supply DC power as a backup power to the server racks 102 from a battery cabinet 112. Each of the rack columns 104 conforms to a standard rack width (e.g., 24 inch), which can host server chassis up to 21 inches in width.

In each of the rack columns 104, space is divided vertically into three power zones, each of which is equipped with a power shelf, such as the power shelf 100. Each power zone has three pairs of positive and negative 12V DC power bus bars called "buses," and space that accommodate one or more server chassis. The power shelf 100 is a hot-swappable chassis mounted inside a power zone to provide power to all the devices installed in the power zone. The power shelf 100 comprises one or more power supply units (PSUs) that draw power from the power grid or the battery cabinet 112. For example, a power zone 114 is located in a left column of the server rack 102A and contains power buses 116. The power shelf 100 is installed at the bottom of the power zone 114.

The server racks 102, as illustrated, are consistent with the Open Compute Project standard. An open rack unit or "OU" is a unit for the height of chassis mounted in the racks in accordance with the Open Compute Project standard, where 1 OU is 48 mm high. For example, the power shelf 100 can take up 3 OU of space from the power zone 114 occupying a total of 13 OU.

Figure 1B:
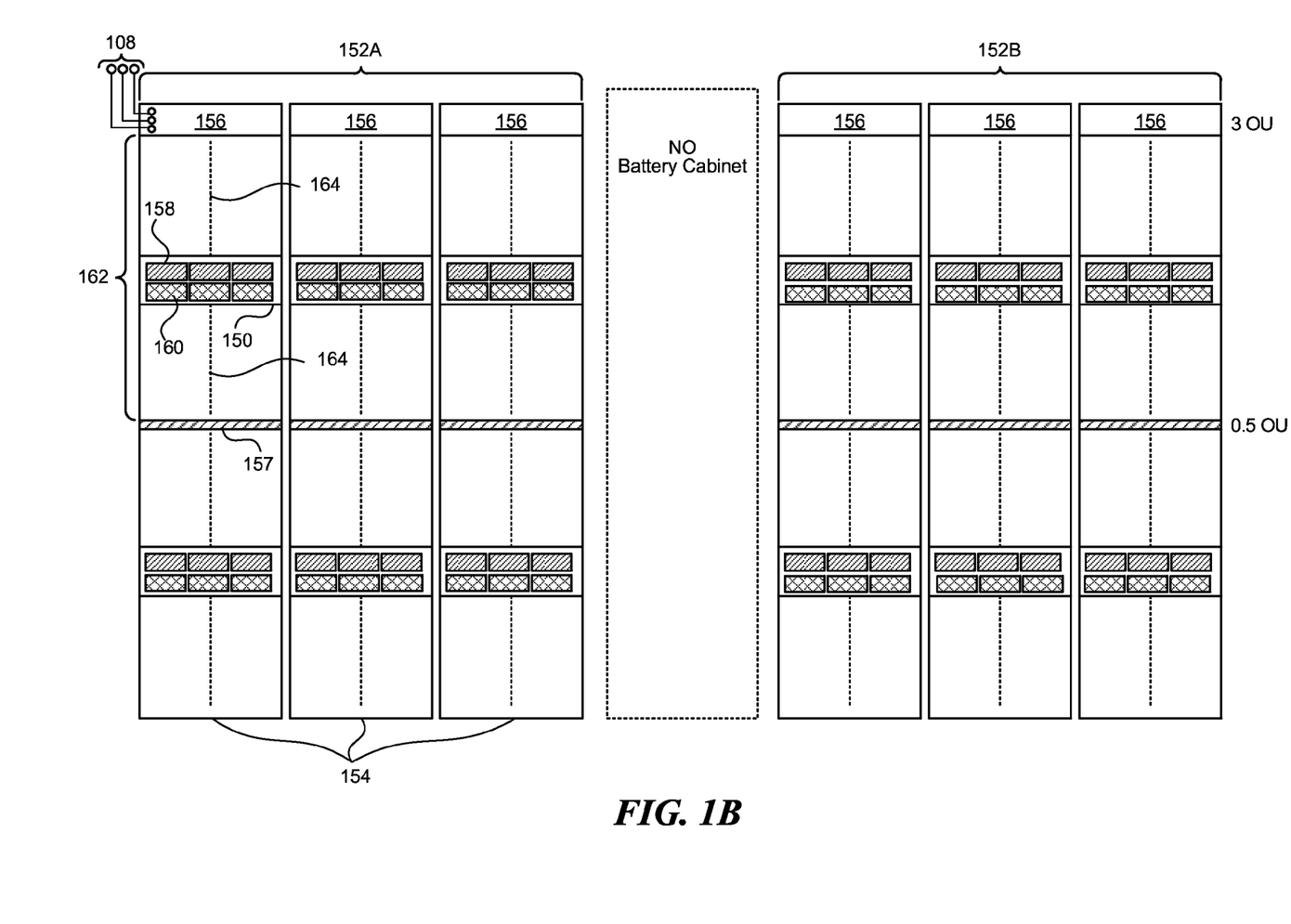
FIG. 1B is a diagram illustrating power shelves for server racks in a data center, in accordance with various embodiments.

FIG. 1B is a diagram illustrating power shelves (e.g., a power shelf 150) for server racks (e.g., a server rack 152A and a server rack 152B, collectively as the "server racks 152") in a data center, in accordance with various embodiments. Each of the server racks 152 may be a single column back, may include three rack columns 154 (or three single column racks), or may include multiple columns. A power rail 156 in the server racks 152 can enclose power lines, breakers, receptacles plugs, three-phase plugs (e.g., P1, P2, and P3) for AC voltage input lines 108, or any combination thereof. Each single column rack can have a rack width (e.g., 600 mm) in accordance with the Open Rack-Open Compute Project standard, which can host server chassis up to 537 mm in width.

The power shelf 150 comprises three PSUs (e.g., a PSU 158). Each of the PSUs draws power from a phase of the AC voltage input lines 108 (e.g., P1, P2, or P3, and Neutral) from the power grid. Each PSU 158 can be paired with a battery backup unit (BBU) 160. In various embodiments, the BBUs in the power shelf 150 never interconnect to each other, but only with their own respective PSUs, paired in the power shelf 150.

In each of the rack columns 154, space can be divided vertically into at least two power zones (e.g., a power zone 162). For example, each of the rack columns 154 can have two power zones, each equipped with one of the power shelf 150 installed in the middle to minimize electrical DC power BUS conduction losses. The power zones can be divided by a separation bar 157. There can be one of the separation bar 157 in the front and one in the rear (e.g., on the same vertical location), embedded in the rack frame. The separation bar 157 can add strength, and greatly improve the mechanical tolerances of the equipment bay given its bay width. This is critical towards the middle of the rack. The separation bar 157 can be a calibrated, welded bar. The power zone 162 can deliver power to its equipment via a DC power bus 164, which is a pair of positive and negative power bus bars (e.g., 12.5V or 12V). In embodiments, the DC power bus 164 is the only source of power in the power zone 162 and the DC power bus 164 provides power to all rack-mounted equipment within the power zone 162. The power zone 162 also has space that accommodates one or more server chassis (e.g., above or below the power shelf 150). If a chassis hosts more than one IT device (e.g., a server or storage node), the voltage from the single bus-bar pair can be splitted inside the chassis. The chassis hot-plugs to the bus-bar pair. The power shelf 150 is a chassis mounted inside the power zone 162 to provide power to all the devices installed in the same power zone 162, while the three PSUs and the three BBUs installed in it are hot-swappable. The power zones in the same rack are electrically isolated from each other. In the illustrated embodiment, the power shelf 150 is installed in the middle of the power zone 162, to minimize losses. However, in other embodiments, the power shelf 150 can be installed in any location in the rack.

Each power zone 162 in the server racks 152 supports chassis of various sizes. In at least one example, the server racks 152 can be consistent with the Open Compute Project standard. For example, the power shelf 150 can take up 3 OU of space from the power zone 162 occupying a total of 19 OU with 8 OU available for rack-mounted equipment both above and under (e.g., a total of 16 OU) the power shelf 150.

The server racks 152 in the data center rely on AC power grids as the main energy source. Power grids generally comprise one or more power generation systems, coupled together with a power-transferring capable conduit, such as power lines. When power is unavailable on all or part of the power grid, the power grid is said to be "down" or experiencing "downtime." Power downtime may be caused by a variety of factors, including over-consumption of available power by users, the failure or unavailability of a power generation system, a failure or breach in power conduit within the power grid, or any other cause that results in a power user being unable to draw power from the power grid. In such instances, other power sources (e.g., the BBU 160 or an emergency power generator) may continue to supply power to the extent they are able, and power users may continue to draw power from these other power sources as long as the power users are connected these other power sources. However, any short-term AC power interruption that may not be compensated by an external UPS or emergency generator, are compensated by the power shelf 150, through the BBUs.

In one embodiment, each power zone 162 in the server racks 152 is powered with at least three PSUs (e.g., each providing 3.3 kW of power) providing at least a total power of 6.6 kW to the power zone 162, with (2+1) redundant shelf (at least one of the PSUs is a redundant PSU). Each PSU (e.g., the PSU 158) includes a PFC module connected to one of the AC voltage input lines 108 (i.e., one of the three available AC phases) from the power grids. The PFC module output is connected in parallel to an isolated step-up converter's output (e.g., an isolated current feed DC-DC converter), into a bulk capacitor, and with the step-up converter powered by a BBU 160's output. A shared voltage node is between the parallel connections. The shared voltage node can maintain a constant voltage (the "BULK voltage"). Two PSUs, providing power through AC inputs of the power grid, or two BBUs can supply sufficient power (e.g., 6.6 kW) to support the equipment in each power zone while a third pair is the redundant pair in case of a potential PSU failure and/or BBU failure. Each current feed converter can start immediately in response to an AC grid outage in conjunction with a low voltage (e.g., caused by AC grid outage) at the shared voltage node. The current feed converter steps-up a DC battery voltage of the BBU 160 to the BULK voltage in conjunction with the low voltage at the shared voltage node. In this way, the BULK voltage is continuously supplied at the shared voltage node even during AC power outage, such that the PSU 158 can continue to deliver a constant voltage output without service interruption or voltage fluctuations at the DC power bus 164. The BULK voltage can be much higher than a suitable voltage for rack-mounted equipment. Hence, in various embodiments, the PSU includes a step-down converter that supplies the suitable voltage to the rack-mounted equipment through the DC power bus 164.

One parameter used to evaluate the power quality is the power factor. Due to sinusoidal waveform and phase shifting, a non-corrected AC-DC power supply has a low power factor (e.g., measured at 65%), which can draw approximately one and a half times greater input RMS current than a rectifier coupled to a PFC module (e.g., the power factor measured at 99%) for the same output loading. A PFC module can be passive or active. The PFC module may be implemented, with interleaved topology to increase the efficiency at light load. The interleave topology may also be implemented in other DC-DC converters described herein to improve efficiency profile against load.

Power shelves can be upgraded or renewed by replacing the BBU or the PSU. The disclosed power shelf topology provides highly reliable backup performance without glitches in voltage output during transitions of AC outages and AC restores while providing a convenient single DC supply to a power zone based on a balanced 3-phase AC supply. The disclosed power shelf topology further allows each BBU and PSU pair to be tested directly with the online server load, without service interruptions. The BBU can supply power to the shared voltage node whether or not the PFC module is in operation by releasing current controlled by the current feed converter.

The batteries (e.g., Li-Ion batteries) of the BBU 160 can be one pack or multiple packs. For example, the BBU 160 can include a pack of batteries in the dimensions of 11×2×2 (i.e., 4 sets of 11 batteries). The BBU 160 can include an enclosure that protects the batteries. The enclosure can include one or more fans to promote air flow for cooling, or sealed-off without fans. The enclosure can include one or more handles for ease of replacing the BBU 160 when a failure or glitch occurs (e.g., the BBUs being hot-plug modules). The enclosure further includes one or more connectors or connection interfaces to couple to the current feed converter, hot-swap, blind-mating.

To address the needs of reliable and efficient power access for data centers, embodiments provide at least a redundant pair of PSU and BBU coupled in parallel with at least two other pairs of PSU and BBU (i.e., a (2+1) redundant scheme). In this way, at least two advantages are achieved. Whether there is an AC power outage, the power shelf can continue to provide backup power to the system (e.g., the power zone 162). There can be a 90 seconds time out for the backup operations, that is more than enough to compensate for the delay of the AC emergency generator to turn on. Moreover, even when one BBU fails or is under battery testing, other PSU and BBU pairs can sufficiently provide power to the power zone 162 of the system (e.g., of the Open Rack). In some embodiments, the redundancy is only used in case of PSU failure or BBU failure, and the power backup feature is never or at least rarely used to compensate a hardware failure (only to compensate an AC power grid failure). This redundancy scheme obviates the need to maintain a costly data center centralized UPS system, a local AC UPS, or backup battery cabinets, or complicated circuitry to provide backup power when AC power grid fails.

Figure 2:
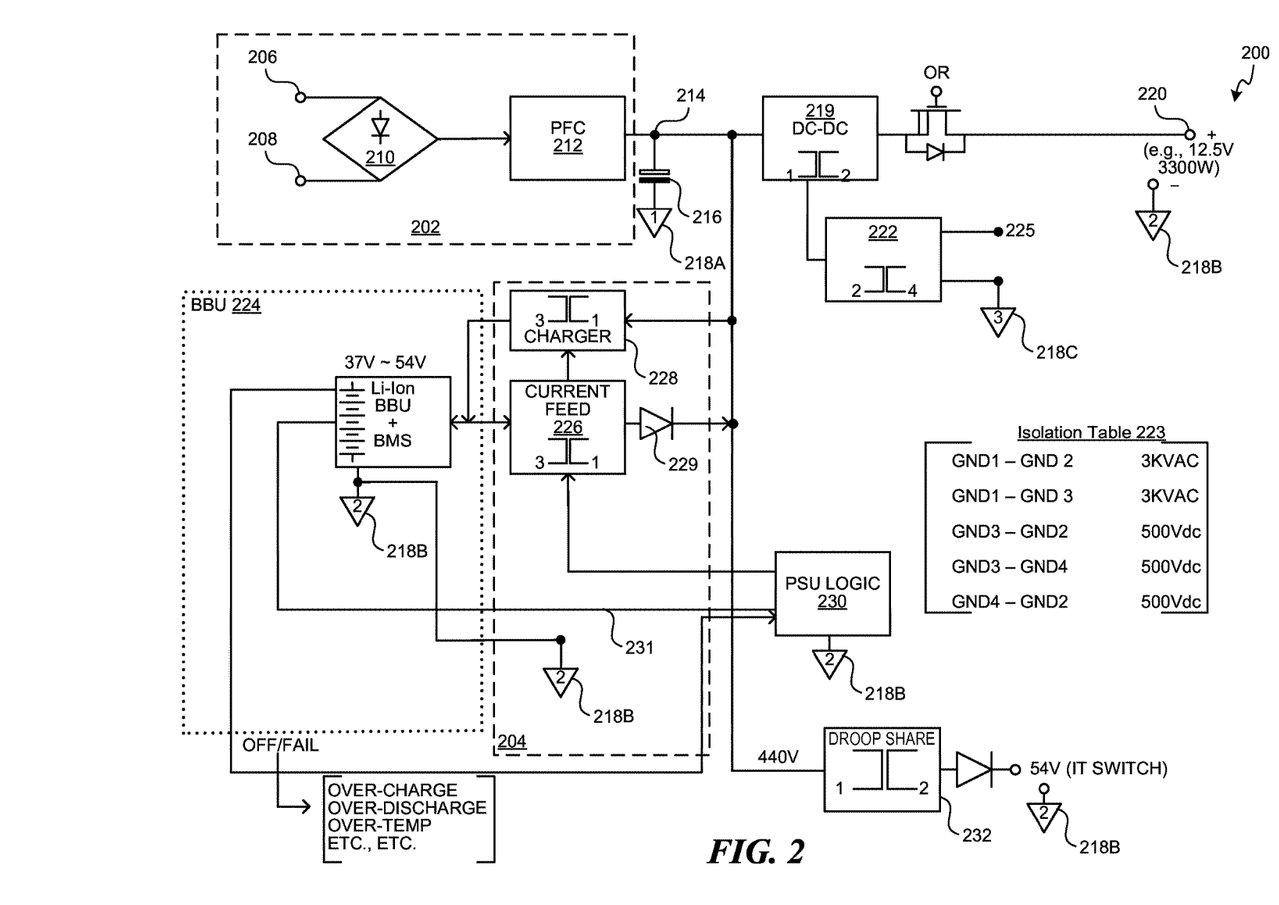
FIG. 2 is a circuit diagram of a power supply circuit of a power supply unit (PSU) in a power shelf, in accordance with various embodiments.

FIG. 2 is a circuit diagram of a power supply circuit 200 of a PSU in a power shelf, in accordance with various embodiments. For example, a power system can include multiple power shelves, e.g., the power shelf 150 of FIG. 1B, within a server rack. Each power shelf includes at least two PSUs (in a single phase solution) or includes at least three PSUs (in a three-phase solution). In various embodiments, each PSU includes the power supply circuit 200 disclosed herein. The power supply circuit 200 includes an AC power circuit 202 and a DC power circuit 204. The AC power circuit 202 receives an AC phase 206 of AC power and a neutral line 208 from a power grid. For example, the AC phase 206 can provide a 277V AC power. The AC phase 206 can be one of three AC phases provided through the power grid. The AC phase 206 and the neutral line 208 can feed into a rectifier circuit 210 to rectify the AC power into or approximately into DC voltage. The rectifier circuit 210 may further include an inrush control protection circuit (not shown) to prevent electromagnetic interferences and electric discharges of the AC phase 206.

The rectifier circuit 210 can be coupled to a PFC module 212. The PFC module 212 provides power correction to the rectified output of the rectifier circuit 210. For example, the PFC module 212 can remove effects of leakage inductance or reactance that limits the output current of the rectifier circuit 210 and/or adjust the power factor and the iTHD (current total harmonic distortion). The PFC module 212 can output a DC voltage (hereinafter the "bulk voltage") to a bulk voltage terminal 214. That is, the AC power circuit 202 receives an electrical input at the AC phase 206 and provides a DC electrical output at the bulk voltage terminal 214.

A bulk capacitor 216 can be coupled between the bulk voltage terminal 214 and a first negative return terminal 218A. The bulk capacitor 216 can hold electric charge at the bulk voltage terminal 214 such that a substantially constant DC voltage (e.g., substantially around 440 volts) can be maintained at the bulk voltage terminal 214 even without the PFC module 212 being operational. The bulk capacitor 216 can provide smooth voltage transitions during AC outages and AC restores.

The bulk voltage terminal 214 is coupled to a DC-DC converter 219 as its input. For example, the bulk voltage terminal 214 can be connected via a high resolution current share bus. The high resolution current share bus can be used to provide high output current share accuracy. In some embodiments, the converters drawing current from the bulk voltage terminal 214 share the output current very precisely. In this way, the respective input AC RMS currents would be well balanced and so, the three three-phase input AC currents would have similar values and therefore balanced. The precise current sharing enables the power supply circuit 200 to maintain the same load over the three phases of a three-phase AC input from the power grid.

The DC-DC converter 219 can down-step the DC voltage to a lower voltage. The lower voltage is provided throughout a power zone associated with the PSU that the power supply circuit 200 is part of. The lower voltage is provided to the power zone via a DC bus 220. The DC bus 220, for example, provides a 12V or a 12.5V DC voltage relative to a second negative return terminal 218B. The DC bus 220 can create a common DC voltage used to power the system in a server rack supported by the power supply circuit 200. For example, the DC bus 220 can also connect in parallel to other PSU and BBU pairs. This parallel connection is advantageous since if one of the parallel connections suddenly fails, the remaining two would not be affected by the failure and would be able to carry on the full power required by the power system.

In various embodiments, the power supply circuit 200 represents one of three power modules in a power shelf, where each power module receives a single phase input. The DC bus 220 is connected in parallel to other output voltages other than the output of the DC-DC converter 219. This connection enables a redundant power shelf solution. A power shelf with these parallel PSU bus connections generate enough power to sustain the system load. In other embodiments, the DC bus 220 may instead by connected to one power module with a three-phase AC input with a second power module connected in parallel for redundancy. These alternative embodiments would cost more because a (1+1) redundant scheme and a three-phase input power supply normally costs more than a single-phase input power supply. Further, the three-phase input is normally less efficient than single phase AC inputs.

The DC-DC converter 219 can be coupled to an isolated transceiver 222 that guards against large negative return-to-negative return differentials. The isolated transceiver 222 can be coupled to a third negative return terminal 218C. The negative return terminals are isolated from each other to avoid return loop currents and to limit differential and common mode noise. The negative return isolation also avoids load return currents that may be flowing through high power current return paths (e.g., taking the wrong route through signal return paths when the negative returns are not isolated). The power supply system can share the same eventual negative return termination at the power shelf. If the isolated transceiver 222's negative return is isolated at the source, return loop currents would be impossible. An isolation table 223 lists the voltage isolation levels of the (isolated) converters built-in inside the power supply circuit 200. These isolations levels can be sized by those who design the isolated power converters.

The isolated transceiver 222 may output a digital line 225 for external communication (e.g., health status reporting) with devices outside of the power shelf or for internal communication between instances of the power supply circuit 200 in the same power shelf (e.g., a power shelf with three power supply circuit 200 each corresponding to a PSU and BBU pair).

The DC power circuit 204 is coupled to a battery backup unit (BBU) 224 (shown with dotted lines to indicate that the BBU 224 is not part of the power supply circuit 200), and includes a current feed converter 226 and a battery charger 228. For example, the DC power circuit 204 may include an electrical interface to couple with the BBU 224. The BBU 224 can include a set of batteries connected in series. For example, the set of batteries can provide up to 37V to 54V of DC differential relative to the second negative return terminal 218B. The BBU 224 can detachably connect to the power supply circuit 200 of the PSU. The DC voltage output of the BBU 224 is connected to the current feed converter 226. The current feed converter 226 steps up the DC voltage of the BBU 224 to the constant DC voltage at the bulk voltage terminal 214. In some embodiments, an asymmetric conductance component 229 (e.g., a diode) is coupled in between the current feed converter 226 and the bulk voltage terminal 214. The asymmetric conductance component 229 ensures that current flows only in the direction from the current feed converter 226 to the bulk voltage terminal 214 and not vice versa.

The BBU 224 supports powering of the DC bus 220 in case of AC power grid outage. The current feed converter 226 can be configured to discharge the BBU 224 for a set amount of time during outage (e.g., a 90 seconds timeout), where the BBU 224 shuts down when the backup sequence reaches the set amount of time. In some embodiments, the BBU 224's voltage is only connected within the power supply circuit 200 representing its corresponding PSU, forming a pair. Each instance of the BBU 224 is independent against remaining BBUs installed in the power shelf. For instance, the BBU 224 extends the hold-up time of its corresponding PSU from a usual 20 milli-seconds (e.g., by a capacitor) to full 90 seconds. The 20 milli-seconds may correspond to a full cycle of the input AC sinusoidal voltage at 50 HZ.

The battery charger 228 provides suitable voltage to charge the BBU 224 when the AC power circuit 202 is operational (e.g., the AC phase 206 is providing power and the PFC is functioning). The battery charger 228, for example, can be an isolated step-down converter connected between the bulk voltage terminal 214 and the BBU 224.

The power supply circuit 200 can include a PSU logic module 230. The PSU logic module 230 can be an application specific integrated circuit (ASIC), a field programmable gate array (FPGA), a controller, a processor, or other logical units capable of computation. The PSU logic module 230 is configured to control the current passing through the current feed converter 226. The PSU logic module 230 can be coupled to the BBU 224 (e.g., through the electrical interface of the DC power circuit 204 or through another electrical interface) to monitor power condition of the BBU 224 and to react on signals coming from the BBU 224. For example, the BBU logic can determine an internal failure (and other electrical and environmental conditions) and report it to the PSU logic module 230 of same pair. For example, the BBU logic can communicate with the PSU logic module 230 through a digital bus 231. The digital bus 231 may be used for communication between the BBU and the PSU logic module 230 as well as for reporting state of health information from the BBU to the PSU logic module 230. The PSU logic module 230 can also determine when the BBU 224 is over-charged, over-discharged, over-heated, and etc. Based on the power condition of the BBU 224, the PSU logic module 230 can assess in real-time the health of the pair (PSU and BBU), and stop either charge or discharge as needed, under several protection modes. For example, when performing a battery test, the PSU logic module 230 can discharge the BBU 224 at constant current, constant power, or at real-time system power. The PSU logic module 230 can also stop the BBU test at anytime as needed or when considered necessary per diagnostic by the PSU logic module 230 or the BBU logic. Similarly, the PSU logic module 230 can discharge the BBU 224 for backup power discharge in case of AC power grid outage.

The power supply circuit 200 can further include a droop share converter 232. The droop share converter 232 can be a low-power isolated droop share converter. The droop share converter 232 is coupled in parallel to the respective DC-DC converters (e.g., the DC-DC converter 219) in the remaining power modules in the power shelf. The droop share converter 232 is a DC to DC converter that steps down the bulk voltage to a DC voltage different from the DC voltage at the DC bus 220 (e.g., also known as "AUX voltage", and can be typically 54V DC). Droop share converters enable load sharing in an array of converters. For example, the droop share converter 232 can artificially increase the output impedance to force the currents through the DC-DC converter 219 and the droop share converter 232 to be equal, without actually dissipating any power. This may be accomplished, for example, by an error signal which is interjected into the control loop of the droop share converter 232.

In various embodiments, the AUX voltage at the DC bus 220 is protected from AC power grid outage, because the DC-DC converter 219 is fed from the BULK voltage terminal 214 within the same PSU. This AUX voltage can be conveniently used to power rack switching gears, and any other auxiliary rack gears that may need continuous reliable power. Switching gears can normally be powered by one power supply with an additional power supply for redundancy (e.g., a (1+1) redundant power setup). Hence, normally switching gears can use two power supplies in parallel, while one power supply is enough to sustain the full load. At the rack level, the two power supplies can be fed by the AUX voltage coming from a first power shelf installed in the rack, and the AUX voltage coming from a second power shelf in the rack. This would be a full redundant layout, where there are two independent AUX sources, each one with three pairs of PSU and BBU (e.g., a (2+1) redundant setup as explained above), and two independent power supplies installed in the switching gear.

Each of the modules/circuits/components may operate individually and independently of other modules, circuits, or components. Some or all of the circuits, components and/or modules may be combined as one component or module. A single module/circuit/component may be divided into sub-modules, each sub-module performing a separate electrical transformation or transformations of the original single module/circuit/component.

Figure 3:
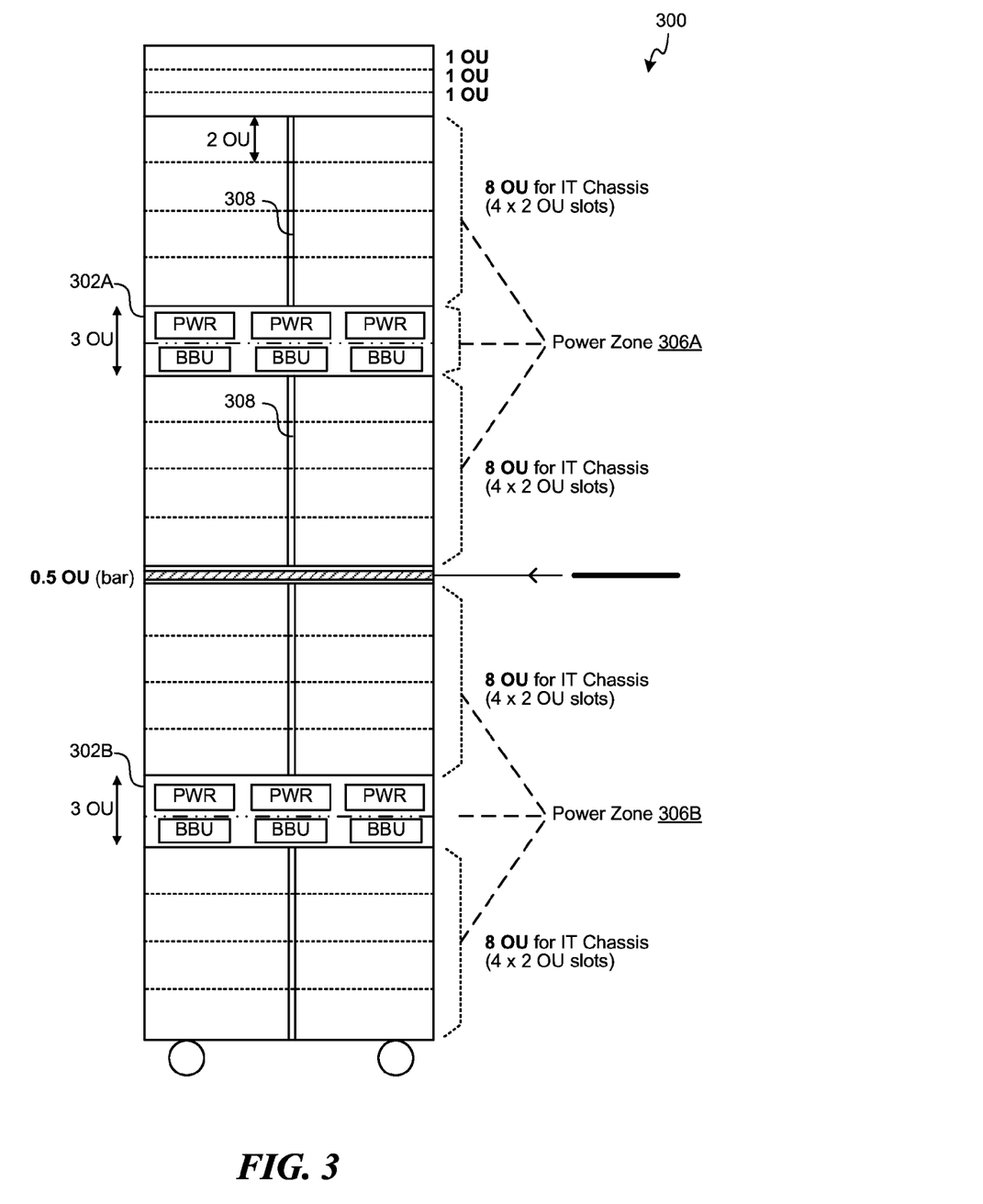
FIG. 3 is a block diagram illustrating a first embodiment of a rack column implementing the power shelves that are in accordance with various embodiments.

FIG. 3 is a block diagram illustrating a first embodiment of a rack column 300 implementing the power shelves that are in accordance with various embodiments. For example, the rack column 300 can be one of the rack columns 104 of FIG. 1. The rack column 300 includes two power shelves (e.g., a power shelf 302A and a power shelf 302B, collectively as the "power shelves 302"). Each of the power shelves 302 includes three PSU and BBU pairs. Each PSU may include a power supply circuit (e.g., the power supply circuit 200 of FIG. 2). Each of the power shelves 302 establishes its own power zone (e.g., the power shelf 302A powers a power zone 306A and the power shelf 302B powers a power zone 306B). For example, the power shelf 302A can provide power to the power zone 306A via DC bus bars 308. The DC bus bars 308 can be coupled in parallel to the power supply circuits of the PSUs. The DC bus bars 308 can bundle two wires (positive and negative terminations, with negative chassis pre-mating bus bar) providing a DC differential voltage (e.g., 12.5V). The two power zones are electrically isolated from each other. In some embodiments, there may be a provision to connect the power zones in the rear of the rack making up one sole power zone. In this case, only one power shelf each rack would be used for a particular low-power implementation.

In this embodiment of the rack column 300, the power shelves 302 are positioned in the middle of their respective power zones. One set of the DC bus bars 308 extends above the power shelves 302 and another set extends below the power shelves 302. This positioning advantageously reduces distribution conduction losses from the DC bus bars 308 by minimizing the length of each set of the DC bus bars 308 and by splitting the current in half.

The rack column 300 may be in accordance with the Open Compute Project V2 Open Rack having a rack height of 87 inches. Power input equipment, e.g., the top power rail 106 of FIG. 1, can take up 1 OU to 3 OU of space in the rack column 300. For example, the power zone 306A provides 18 OUs of space, including 8 OU of space above the power shelf 302A, 8 OU of space below the power shelf 302A, and 2 OU of space taken up by the power shelf 302A. The two power zones 306A and 306B can be separated by a separation bar (e.g., the separation bar 157 of FIG. 1B) that takes up 0.5 OU of space. The separation bar can serve as a stabilizer and a calibrator. For example, the separation bar can be 339 mm long.

Figure 4:
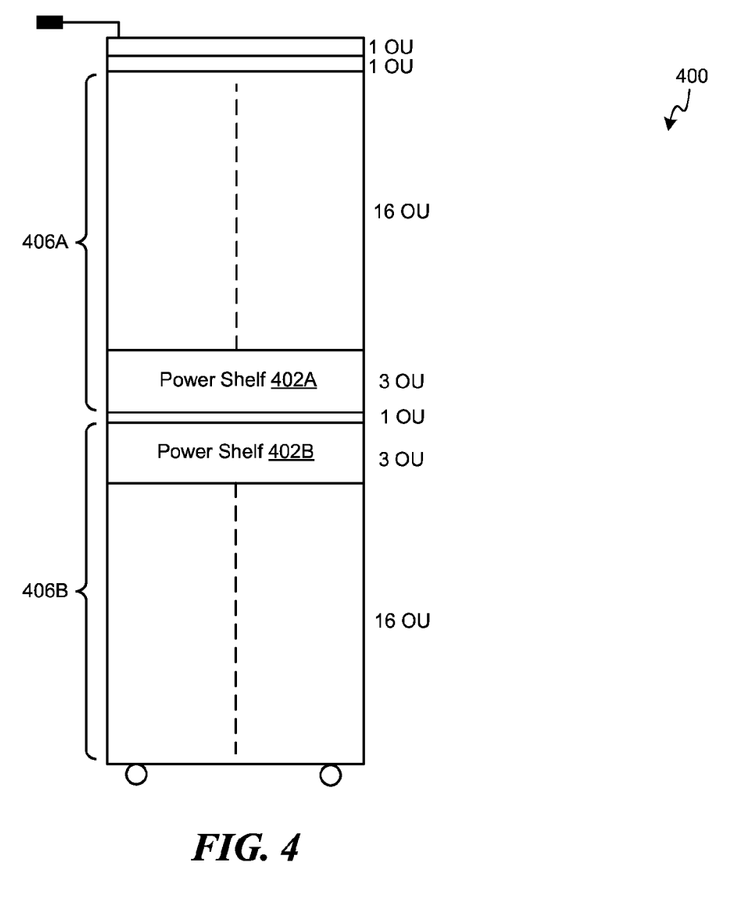
FIG. 4 is a block diagram illustrating a second embodiment of a rack column with the power shelves that are in accordance with various embodiments.

FIG. 4 is a block diagram illustrating a second embodiment of a rack column 400 with the power shelves that are in accordance with various embodiments. For example, the rack column 400 can be one of the rack columns 104 of FIG. 1. The rack column 400 includes two power shelves (e.g., a power shelf 402A and a power shelf 402B, collectively as the "power shelves 402"). Each of the power shelves 402 includes three PSU and BBU pairs. Each PSU may include a power supply circuit (e.g., the power supply circuit 200 of FIG. 2). Each of the power shelves 402 establishes its own power zone (e.g., the power shelf 402A powers a power zone 406A and the power shelf 402B powers a power zone 406B).

The rack column 400 differs from the rack column 300 of FIG. 3 in that the power shelves 402 are located in the middle of the rack column 400 and at the ends of the respective power zones 406A and 406B. For example, the power shelf 402A is located at the bottom of the power zone 406A and the power shelf 402B is located at the top of the power zone 406B.

Figure 5:
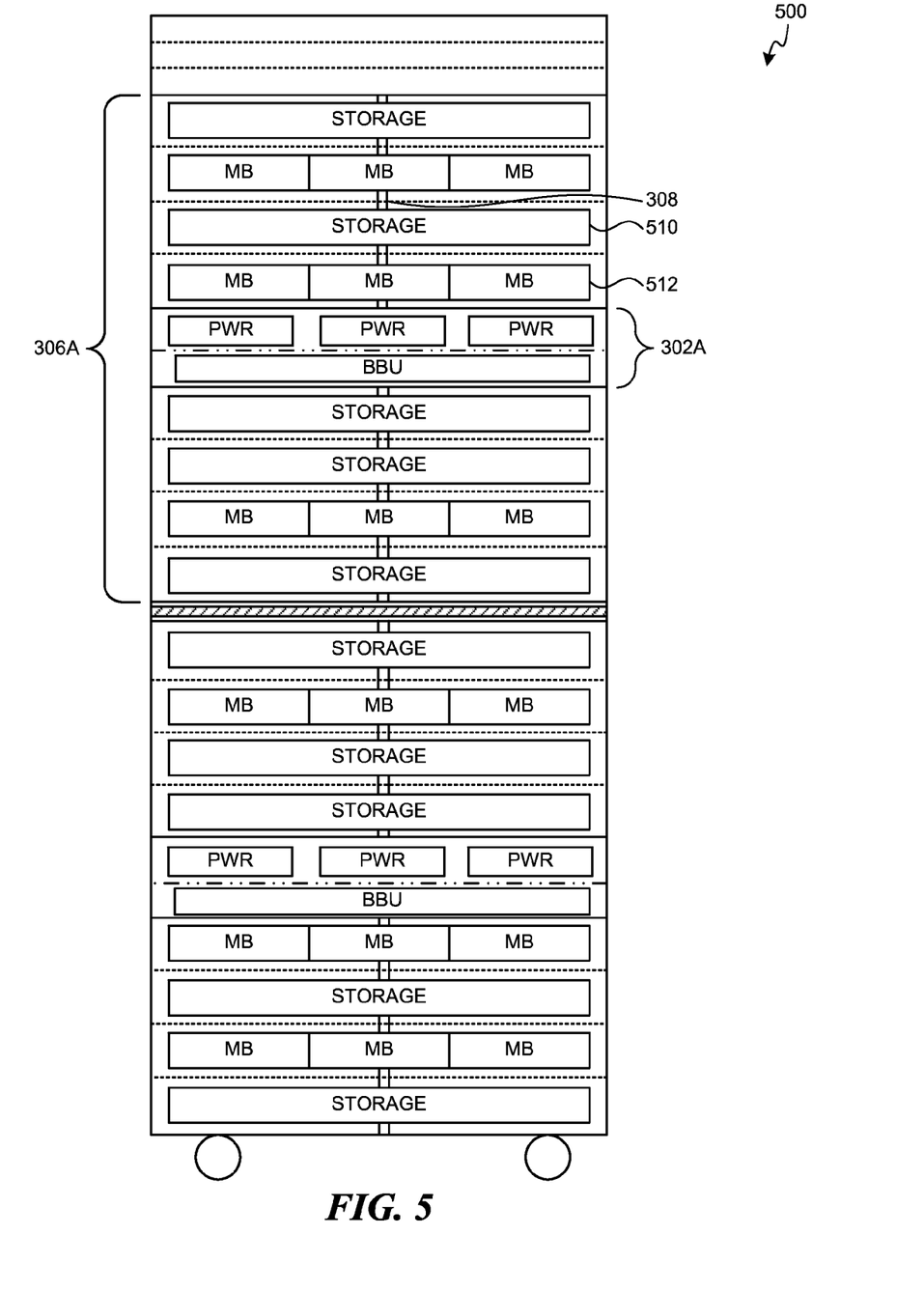
FIG. 5 is a block diagram illustrating the rack column of FIG. 3 containing representative rack-mounted equipment, in accordance with various embodiments.

FIG. 5 is a block diagram illustrating the rack column 300 of FIG. 3 containing representative rack-mounted equipment, in accordance with various embodiments. The representative rack-mounted equipment in the power zone 306A may include storage devices 510 in 2 OU slots and mounting brackets 512 that are attached to swappable chassis of computing devices.

Figure 6:
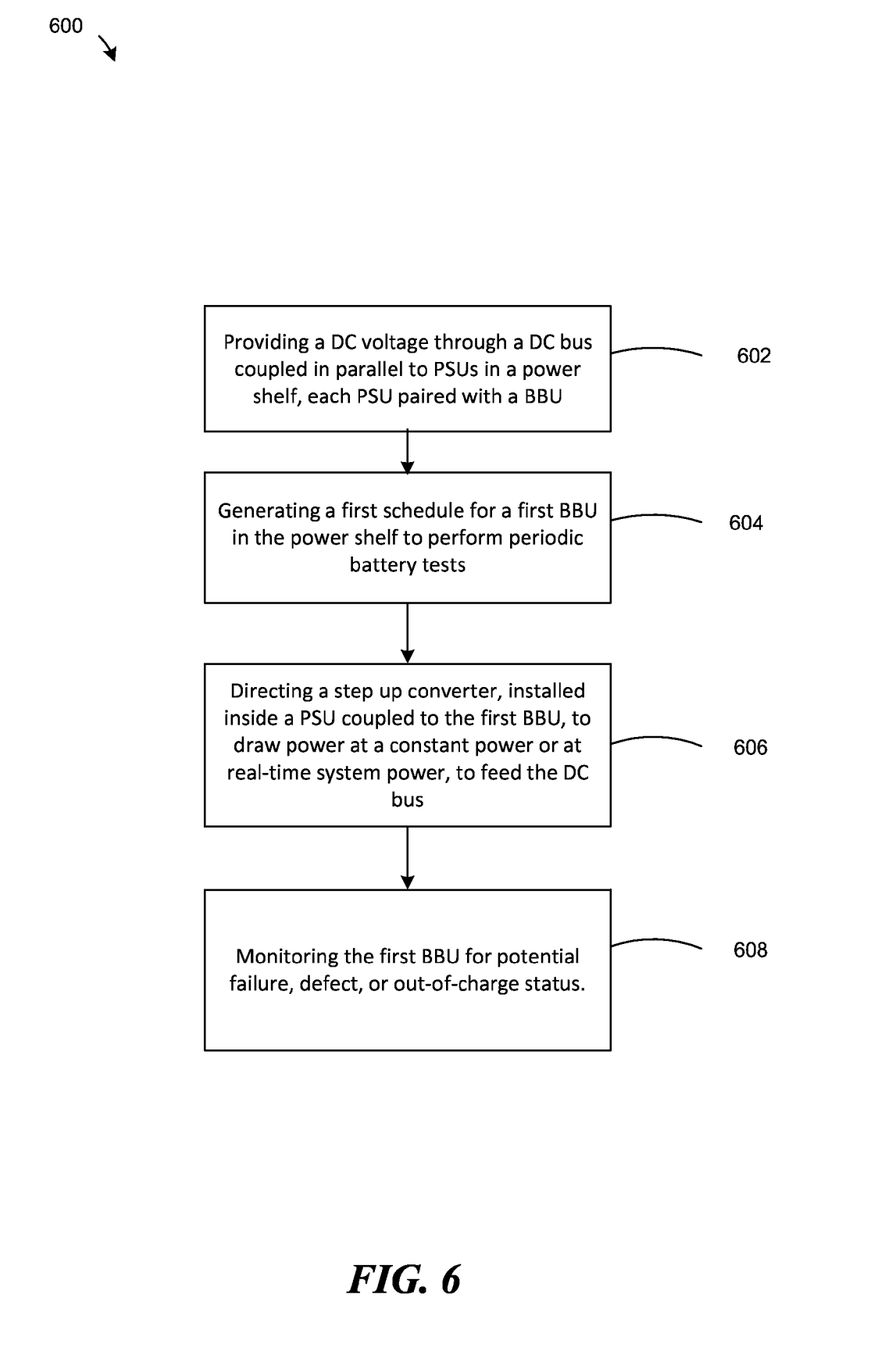
FIG. 6 is a flow chart of a method of conducting a backup battery unit (BBU) testing in a power shelf of a server rack, in accordance with various embodiments.

FIG. 6 is a flow chart of a method 600 of conducting a backup battery unit (BBU) testing in a power shelf (the power shelf 150 of FIG. 1B, one of the power shelves 302A and 302B of FIG. 3, or one of the power shelves 402A and 402B of FIG. 4) of a server rack, in accordance with various embodiments. The method 600 may be enabled by the power supply circuit 200 of FIG. 2. The method 600 can begin in step 602 of providing a DC voltage through a DC bus (e.g., the DC power bus 164 of FIG. 1B, the DC bus 220 of FIG. 2, the DC bus bars 308 of FIG. 3) coupled in parallel to power supply units (PSUs) in the power shelf, each PSU (e.g., the PSU 158 of FIG. 1B) paired with a corresponding backup battery unit (BBU) (e.g., the BBU 160 of FIG. 1B or the BBU 224 of FIG. 2). Here, the power shelf includes at least a redundant pair of PSU and BBU, such that voltage and power is supplied through the DC bus sufficient to power the rack-mounted equipment even when one of the multiple pairs is inoperative (e.g., because of failure or battery test). Each PSU can include a power circuit (e.g., the power supply circuit 200 of FIG. 2) configured to rectify an AC phase from an external multi-phase AC power source or draw power from the corresponding BBU when the PSU fails to provide sufficient voltage.

Then in step 604, a power shelf can generate a first schedule for a first BBU, corresponding to the PSU in the power shelf, to perform a battery test. For example, generating the first schedule may include: (a) a BBU controller (e.g., a BBU logic module) in the first BBU assigning a random initial day of when a battery test is to perform (e.g., this initial day count can be stored as a random number inside the BBU EEPROM); (b) the BBU controller then sending a battery test request to the first PSU; and (c) in response, a PSU controller (e.g., the PSU logic module 230 of FIG. 2) generating another random number corresponding to a time within the next 24 hours to perform the battery test.

In some embodiments, a battery test is not scheduled unless the power shelf is determined to be healthy. Here, "healthy" means that the power shelf is still redundant (i.e., capable of providing power utilizing only a subset of the PSU and BBU pairs) and that all of the PSUs and the BBUs in the power shelf are functional. In some embodiments, if the first BBU sends a battery test request while the power shelf is not redundant, the battery test request will be queued until the power shelf is determined to be redundant again (e.g., after the malfunctioning PSU or BBU is serviced). In some embodiments, if the first BBU is undergoing a battery test in the power shelf that is healthy and redundant and at the same time another BBU sends a second battery test request to its corresponding PSU, then the corresponding PSU would queue the second battery test request until the first BBU finishes its battery test and is again fully recharged. These features are enabled by a communication channel between the power modules in the power shelf to communicate with each other using a digital bus running inside the power shelf (unlike an external bus such as RS-485 that is used to report status of the power shelf to the outside world).

When the first schedule indicates a first battery test, the PSU controller can direct, in step 606, a step up converter (e.g., the current feed converter 226 of FIG. 2), installed inside the power supply module and coupled to the first BBU, to draw power at constant power (constant current) or at real-time system power through a BULK voltage node (e.g., the bulk voltage terminal 214 of FIG. 2) and then through the DC bus. The step up converter can be in the power circuit of the PSU corresponding to the first BBU. The controller can monitor, in step 608, the first BBU via the controller for potential failure or defect. The monitoring can include determining whether the first BBU is out of charge, or following other methods or processes able to predict the state of health (SOH) of the first BBU after discharging. For instance, a SOH profile can be determined in different ways, including determining the SOH profile using whatever real-time load is offered by the system divided by the number of power modules installed in the power shelf that share the output current. When the first BBU is out of charge or when the first BBU's self-check (e.g., battery test) sequence is terminated, the PSU controller can direct the step up converter to stop drawing current through the first BBU and charge the first BBU via a charge component in the power circuit.

In various embodiments, a battery test is performed to periodically assess the "health status" and the eventual "end of life" status of the battery pack. The battery test can determine that a BBU is at its "end of life." At the "end of life," the BBU would need to be replaced by a new BBU because the batteries are now judged too old in accordance with the last battery test. Too old, for example, may mean that the batteries in the BBU are incapable of holding at least the minimum charge necessary to perform a full 90 seconds backup sequence for its corresponding PSU at full power. When the BBU is determined to be at the "end of life," the power shelf would be operating as a non-redundant shelf. This is a sub-optimum situation because at most only two pairs (of BBU and PSU) in the power shelf are working properly.

While processes or methods are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. In addition, while processes or blocks are at times shown as being performed in series, these processes or blocks may instead be performed in parallel, or may be performed at different times.

Some embodiments of this disclosure have other aspects, elements, features, and steps in addition to or in place of what is described above. These potential additions and replacements are described throughout the rest of the specification. For example, embodiments include: a power shelf for serving a power zone within a server rack. The power shelf can include a DC bus configured to provide DC power to rack-mounted equipment within the power zone. The DC bus may be configured to deliver power from the power circuit to all rack-mounted equipment within the power zone and can be the only source of power within the power zone. The power shelf can also include multiple pairs of backup battery units (BBUs) and power supply units (PSUs). The multiple pairs include at least a redundant pair, such that voltage and power is supplied through the DC bus sufficient to power the rack-mounted equipment even when one of the multiple pairs is inoperative. The outputs of the PSUs and the DC bus can be connected to a common voltage node. The power shelf can further include a power circuit, in each PSU of each of the multiple pairs, configured to rectify an AC phase from an external multi-phase AC power source, wherein the power circuit is configured to draw power from one of the BBUs paired to the PSU when the PSU fails to provide power sufficient to power the rack-mounted equipment. The power circuit in each PSU can be coupled to exactly one AC phase of the external multi-phase AC power source. Each power circuit can include a bulk capacitor to hold power for at least one cycle of the AC phase. The power circuit can also include a battery charger for the BBU paired to the PSU.

Embodiments also include a power supply circuit. The power supply circuit includes: an AC-to-DC circuit configured to convert an alternating current (AC) phase from multi-phase AC inputs to a direct current (DC) at a shared voltage node; a DC interface to connect with a backup battery unit (BBU); an asymmetric conductance component having a terminal electrically coupled to the shared voltage node; a step-up converter electrically coupled, in series, between the DC interface and the asymmetric conductance component; a bulk capacitor electrically coupled between the shared voltage node and an electric ground to hold power for at least one cycle of the AC phase; and a first DC-DC converter configured to draw power from the shared voltage node to supply power to load in a server rack.

What is claimed is:

1. A power shelf for serving a power zone within an information technology (IT) equipment rack, comprising:
   a DC bus configured to provide DC power to rack-mounted equipment within the power zone;
   multiple pairs of backup battery units (BBUs) and power supply units (PSUs), wherein the multiple pairs include at least a redundant pair, such that voltage and power is supplied through the DC bus sufficient to power the rack-mounted equipment even when one of the multiple pairs is inoperative;
   a power circuit, in each PSU of each of the multiple pairs, configured to rectify an AC phase from an external multi-phase AC power source, wherein the power circuit is configured to draw power from one of the BBUs paired to the PSU when the PSU fails to provide power sufficient to power the rack-mounted equipment; and
   a controller configured to schedule periodic battery tests, wherein the controller is configured to perform a battery test by:
   directing a step UP converter coupled to a first BBU to draw power at a constant current to feed the DC bus, wherein the step up converter is in the power circuit of a first PSU corresponding to the first BBU; and
   monitoring the first BBU for potential failure or defect.

2. The power shelf of claim 1, wherein outputs of the PSUs and the DC bus are connected to a common voltage node.

3. The power shelf of claim 1, wherein the DC bus is configured to deliver power from the power circuit to all rack-mounted equipment within the power zone and is an only source of power within the power zone.

4. The power shelf of claim 1, wherein the power circuit includes a battery charger for the BBU paired to the PSU.

5. The power shelf of claim 1, wherein each power circuit includes a bulk capacitor to hold power for at least one cycle of the AC phase.

6. The power shelf of claim 1, wherein the power circuit in each PSU is coupled to exactly one AC phase of the external multi-phase AC power source.

7. A method of performing a battery test in a power shelf, comprising:
providing a DC voltage through a DC bus coupled in parallel to power supply units (PSUs) in the power shelf, each PSU paired with a corresponding backup battery unit (BBU), wherein the power shelf includes at least a redundant pair of PSU and BBU, such that voltage and power is supplied through the DC bus sufficient to power rack-mounted equipment even when one of the multiple pairs is inoperative and wherein each PSU includes a power circuit configured to rectify an AC phase from an external multi-phase AC power source or draw power from the corresponding BBU when the PSU fails to provide power and voltage sufficient to power the rack-mounted equipment;
generating a first schedule for a first BBU in the power shelf to perform periodic battery tests;
when the first schedule indicates a first battery test, directing, via a controller, a step up converter coupled to the first BBU to draw power at a constant current to feed the DC bus, wherein the step up converter is in the power circuit of the PSU corresponding to the first BBU; and
monitoring the first BBU via the controller for potential failure or defect.

8. The method of claim 7, wherein monitoring includes determining whether the first BBU is out of charge.

9. The method of claim 8, further comprising:
when the first BBU is determined to be out of charge, directing the step up converter to stop drawing current through the first BBU; and
charging the first BBU via a charge component in the power circuit.

10. The method of claim 7, wherein generating the first schedule includes assigning a random initial wait day corresponding to when to begin repeating the periodic battery tests and assigning a random wait time that delays the periodic battery tests by a maximum of 24 hours.

* * * * *